(12) United States Patent
Haba

(10) Patent No.: US 9,553,076 B2
(45) Date of Patent: *Jan. 24, 2017

(54) STACKABLE MOLDED MICROELECTRONIC PACKAGES WITH AREA ARRAY UNIT CONNECTORS

(71) Applicant: Tessera, Inc., San Jose, CA (US)

(72) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/878,548

(22) Filed: Oct. 8, 2015

(65) Prior Publication Data

US 2016/0086922 A1    Mar. 24, 2016

Related U.S. Application Data

(63) Continuation of application No. 12/839,038, filed on Jul. 19, 2010, now Pat. No. 9,159,708.

(51) Int. Cl.
    *H01L 23/52*    (2006.01)
    *H01L 25/065*   (2006.01)
    (Continued)

(52) U.S. Cl.
    CPC ......... *H01L 25/0657* (2013.01); *H01L 21/561* (2013.01); *H01L 21/563* (2013.01);
    (Continued)

(58) Field of Classification Search
    CPC ...... H01L 21/56; H01L 21/561; H01L 21/563; H01L 21/565; H01L 23/3128; H01L 2225/06565; H01L 2225/06568; H01L 2225/1023; H01L 2225/1029; H01L 2225/1041; H01L 2225/1052; H01L 2225/1058; H01L 2225/107; H01L 23/49833; H01L 24/16; H01L 24/32;H01L 24/48; H01L 23/49816; H01L 24/49; H01L 24/73; H01L 24/92; H01L 24/97; H01L 25/105; H01L 25/16; H01L 25/50; H01L 2223/6611; H01L 2224/16225; H01L 2224/16235; H01L 2224/2929; H01L 2224/293; H01L 2224/32145; H01L 2224/32225; H01L 2224/32245; H01L 2224/48091; H01L 2224/48105; H01L 2224/48145; H01L 2224/48227; H01L 2224/4911; H01L 2224/73204; H01L 2224/73207; H01L 2224/73215; H01L 2224/73253; H01L 2224/73265; H01L 2224/81191; H01L 2224/81801; H01L 2224/8385; H01L 2224/92125; H01L 2224/97; H01L 2225/06558
    (Continued)

(56) References Cited

U.S. PATENT DOCUMENTS 3,289,452 A    12/1966   Koellner
3,358,897 A    12/1967   Christensen
(Continued)

FOREIGN PATENT DOCUMENTS

CN    1641832 A    7/2005
CN    1877824 A    12/2006
(Continued)

OTHER PUBLICATIONS

Korean Office Action for Application No. 10-2011-0041843 dated Jun. 20, 2011.
(Continued)

*Primary Examiner* — Thanh T Nguyen
(74) *Attorney, Agent, or Firm* — Lerner, David, Littenberg, Krumholz & Mentlik, LLP

(57) ABSTRACT

A microelectronic package having a substrate, a microelectronic element, e.g., a chip, and terminals can have conduc-
(Continued)

tive elements electrically connected with element contacts of the chip and contacts of the substrate. Conductive elements can be electrically insulated from one another for simultaneously carrying different electric potentials. An encapsulant can overlie the first surface of the substrate and at least a portion of a face of the microelectronic element remote from the substrate, and may have a major surface above the microelectronic element. A plurality of package contacts can overlie a face of the microelectronic element remote from the substrate. The package contacts, e.g., conductive masses, substantially rigid posts, can be electrically interconnected with terminals of the substrate, such as through the conductive elements. The package contacts can have top surfaces at least partially exposed at the major surface of the encapsulant.

20 Claims, 13 Drawing Sheets

(51) Int. Cl.
| H01L 21/56 | (2006.01) |
| H01L 23/31 | (2006.01) |
| H01L 23/498 | (2006.01) |
| H01L 25/10 | (2006.01) |
| H01L 25/00 | (2006.01) |
| H01L 25/16 | (2006.01) |
| H01L 23/66 | (2006.01) |
| H01L 23/00 | (2006.01) |

(52) U.S. Cl.
CPC ........ *H01L 21/565* (2013.01); *H01L 23/3107* (2013.01); *H01L 23/3128* (2013.01); *H01L 23/49811* (2013.01); *H01L 23/49816* (2013.01); *H01L 23/49838* (2013.01); *H01L 23/66* (2013.01); *H01L 24/17* (2013.01); *H01L 24/49* (2013.01); *H01L 24/73* (2013.01); *H01L 24/92* (2013.01); *H01L 24/97* (2013.01); *H01L 25/105* (2013.01); *H01L 25/16* (2013.01); *H01L 25/50* (2013.01); *H01L 23/49833* (2013.01); *H01L 24/16* (2013.01); *H01L 24/32* (2013.01); *H01L 24/48* (2013.01); *H01L 2223/6611* (2013.01); *H01L 2224/16225* (2013.01); *H01L 2224/16235* (2013.01); *H01L 2224/16238* (2013.01); *H01L 2224/293* (2013.01); *H01L 2224/2929* (2013.01); *H01L 2224/32145* (2013.01); *H01L 2224/32225* (2013.01); *H01L 2224/32245* (2013.01); *H01L 2224/48091* (2013.01); *H01L 2224/48105* (2013.01); *H01L 2224/48145* (2013.01); *H01L 2224/48225* (2013.01); *H01L 2224/48227* (2013.01); *H01L 2224/4911* (2013.01); *H01L 2224/73204* (2013.01); *H01L 2224/73207* (2013.01); *H01L 2224/73215* (2013.01); *H01L 2224/73253* (2013.01); *H01L 2224/73265* (2013.01); *H01L 2224/81191* (2013.01); *H01L 2224/81801* (2013.01); *H01L 2224/8385* (2013.01); *H01L 2224/92125* (2013.01); *H01L 2224/97* (2013.01); *H01L 2225/0651* (2013.01); *H01L 2225/06517* (2013.01); *H01L 2225/06558* (2013.01); *H01L 2225/06565* (2013.01); *H01L 2225/06568* (2013.01); *H01L 2225/06572* (2013.01); *H01L 2225/107* (2013.01); *H01L 2225/1023* (2013.01); *H01L 2225/1029* (2013.01); *H01L 2225/1041* (2013.01); *H01L 2225/1052* (2013.01); *H01L 2225/1058* (2013.01); *H01L 2924/00011* (2013.01); *H01L 2924/00014* (2013.01); *H01L 2924/014* (2013.01); *H01L 2924/0105* (2013.01); *H01L 2924/01024* (2013.01); *H01L 2924/01029* (2013.01); *H01L 2924/01033* (2013.01); *H01L 2924/01079* (2013.01); *H01L 2924/01082* (2013.01); *H01L 2924/07811* (2013.01); *H01L 2924/15311* (2013.01); *H01L 2924/19107* (2013.01); *H01L 2924/3011* (2013.01); *H01L 2924/351* (2013.01)

(58) Field of Classification Search
USPC ...................................................... 257/686
See application file for complete search history.

(56) References Cited

U.S. PATENT DOCUMENTS

| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,241,456 A | 8/1993 | Marcinkiewicz et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,766,987 A | 6/1998 | Mitchell et al. |

(56) References Cited

U.S. PATENT DOCUMENTS

| | | |
|---|---|---|
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,407,448 B2 | 6/2002 | Chun |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Yin et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin |
| 7,294,928 B2 | 11/2007 | Bang et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |

(56) References Cited

U.S. PATENT DOCUMENTS

| | | |
|---|---|---|
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,902,644 B2 | 3/2011 | Huang et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,970 B2 | 10/2011 | Yamamori et al. |
| 8,058,101 B2 | 11/2011 | Haba et al. |
| 8,071,431 B2 | 12/2011 | Hoang et al. |
| 8,071,470 B2 | 12/2011 | Khor et al. |
| 8,076,770 B2 | 12/2011 | Kagaya et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,299,368 B2 | 10/2012 | Endo |
| 8,304,900 B2 | 11/2012 | Jang et al. |
| 8,314,492 B2 | 11/2012 | Egawa |
| 8,319,338 B1 | 11/2012 | Berry et al. |
| 8,372,741 B1 | 2/2013 | Co et al. |
| 8,404,520 B1 | 3/2013 | Chau et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 | 12/2013 | Sato et al. |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 | 9/2014 | Chau et al. |
| 8,878,353 B2 | 11/2014 | Haba et al. |
| 8,907,466 B2 | 12/2014 | Haba |
| 8,927,337 B2 | 1/2015 | Haba et al. |
| 8,987,132 B2 | 3/2015 | Gruber et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,123,664 B2 | 9/2015 | Haba |
| 9,153,562 B2 | 10/2015 | Haba et al. |
| 9,224,717 B2 | 12/2015 | Sato et al. |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1* | 6/2002 | Taniguchi ............ H01L 23/3128 257/698 |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |

(56) References Cited

U.S. PATENT DOCUMENTS

| | | |
|---|---|---|
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0090524 A1 | 4/2007 | Abbott |
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0277772 A1 | 11/2008 | Groenhuis et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0127686 A1 | 5/2009 | Yang et al. |
| 2009/0128176 A1 | 5/2009 | Beaman et al. |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0025835 A1 | 2/2010 | Oh et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0193937 A1 | 8/2010 | Nagamatsu et al. |
| 2010/0213560 A1 | 8/2010 | Wang et al. |
| 2010/0224975 A1* | 9/2010 | Shin ............... H01L 21/56 257/686 |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0057308 A1 | 3/2011 | Choi et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0175213 A1 | 7/2011 | Mori et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0007232 A1 | 1/2012 | Haba |
| 2012/0015481 A1 | 1/2012 | Kim |
| 2012/0018885 A1 | 1/2012 | Lee et al. |
| 2012/0025365 A1 | 2/2012 | Haba |
| 2012/0043655 A1 | 2/2012 | Khor et al. |
| 2012/0056312 A1 | 3/2012 | Pagaila et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086130 A1 | 4/2012 | Sasaki et al. |
| 2012/0104595 A1 | 5/2012 | Haba et al. |
| 2012/0119380 A1 | 5/2012 | Haba |
| 2012/0145442 A1 | 6/2012 | Gupta et al. |
| 2012/0146235 A1 | 6/2012 | Choi et al. |

(56) References Cited

U.S. PATENT DOCUMENTS

| | | |
|---|---|---|
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2013/0032944 A1 | 2/2013 | Sato et al. |
| 2013/0049221 A1 | 2/2013 | Han et al. |
| 2013/0069222 A1 | 3/2013 | Camacho |
| 2013/0105979 A1 | 5/2013 | Yu et al. |
| 2013/0134588 A1 | 5/2013 | Yu et al. |
| 2013/0241083 A1 | 9/2013 | Yu et al. |
| 2014/0021605 A1 | 1/2014 | Yu et al. |
| 2014/0036454 A1 | 2/2014 | Caskey et al. |
| 2014/0124949 A1 | 5/2014 | Paek et al. |
| 2015/0017765 A1 | 1/2015 | Co et al. |

FOREIGN PATENT DOCUMENTS

| | | |
|---|---|---|
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 1118364 | 1/1999 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 200447702 | 2/2004 |
| JP | 2004-172157 A | 6/2004 |
| JP | 2004281514 A | 10/2004 |
| JP | 2004-319892 A | 11/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20150012285 A | 2/2015 |
| TW | 200810079 A | 2/2008 |
| TW | 200933760 A | 8/2009 |
| TW | 201023277 A | 6/2010 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2010041630 A1 | 4/2010 |
| WO | 2010101163 A1 | 9/2010 |
| WO | 2014107301 A1 | 7/2014 |

OTHER PUBLICATIONS

International Search Report and Written Opinion for Application No. PCT/US2013/026126 dated Jul. 25, 2013.
Taiwanese Office Action for Application No. 100140428 dated Jan. 26, 2015.
Korean Office Action for Application No. 2014-7025992 dated Feb. 5, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6
Kim et al., "Application of Through Mold Via (TMV) as PoP base package", 6 pages (2008).
International Search Report, PCT/US2005/039716, Apr. 5, 2006.
International Search Report Application No. PCT/US2011/024143, dated Sep. 14, 2011.
Korean Search Report KR10-2011-0041843 dated Feb. 24, 2011.
International Search Report and Written Opinion PCT/US2011/044342 dated May 7, 2012.
Bang, U.S. Appl. No. 10/656,534, filed Sep. 5, 2003.

(56) References Cited

OTHER PUBLICATIONS

International Search Report and Written Opinion for Application No. PCT/US2011/044346 dated May 11, 2012.
Partial International Search Report from Invitation to Pay Additional Fees for Application No. PCT/US2012/028738 dated Jun. 6, 2012.
"EE Times Asia" [online]. [Retrieved Aug. 5, 2010]. Retrieved from internet. <http://www.eetasia.com/ART_8800428222_480300_nt_dec52276.HTM>, 4 pages.
Redistributed Chip Package (RCP) Technology, Freescale Semiconductor, 2005, 6 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Jin, Yonggang et al., "STM 3D-IC Package and 3D eWLB Development," STMicroelectronics Singapore/STMicroelectronics France May 21, 2010.
Yoon, PhD, Seung Wook, "Next Generation Wafer Level Packaging Solution for 3D integration," May 2010, Stats ChipPAC LTD.
Search Report from Korean Patent Applicatin No. 10-2010-0113271 dated Jan. 12, 2011.
International Search Report and Written Opinion for PCT/US2011/060551 dated Apr. 18, 2012.
Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
Extended European Search Report for Application No. EP13162975 dated Sep. 5, 2013.
International Search Report and Written Opinion for Application No. PCT/US2013/052883 dated Oct. 21, 2013.
Japanese Office Action for Application No. 2013-509325 dated Oct. 18, 2013.
Office Action from U.S. Appl. No. 12/769,930 mailed May 5, 2011.
International Search Report and Written Opinion for Application No. PCT/US2013/053437 dated Nov. 25, 2013.
International Search Report and Written Opinion for Application No. PCT/US2013/041981 dated Nov. 13, 2013.
Office Action for Taiwan Application No. 100125521 dated Dec. 20, 2013.
Office Action from Taiwan for Application No. 100125522 dated Jan. 27, 2014.
Partial International Search Report for Application No. PCT/US2013/075672 dated Mar. 12, 2014.
Taiwanese Office Action for Application No. 100141695 dated Mar. 19, 2014.
International Search Report and Written Opinion for Application No. PCT/US2013/075672 dated Apr. 22, 2014.
Taiwanese Office Action for Application No. 101138311 dated Jun. 27, 2014.
Chinese Office Action for Application No. 201180022247.8 dated Sep. 16, 2014.
International Search Report and Written Opinion for Application No. PCT/US2011/024143 dated Jan. 17, 2012.
Japanese Office Action for Application No. 2013-520776 dated Apr. 21, 2015.
Taiwanese Office Action for Application No. 102106326 dated Sep. 18, 2015.

* cited by examiner

180

184

184

STACKABLE MOLDED MICROELECTRONIC PACKAGES WITH AREA ARRAY UNIT CONNECTORS

CROSS-REFERENCE TO RELATED APPLICATIONS

This application is a continuation of U.S. patent application Ser. No. 12/839,038, filed Jul. 19, 2010, now U.S. Pat. No. 9,159,708, the disclosure of which is hereby incorporated herein by reference.

BACKGROUND OF THE INVENTION

Microelectronic elements such as semiconductor chips typically are provided in packages which provide physical and chemical protection for the semiconductor chip or other microelectronic element. Such a package typically includes a package substrate or chip carrier which can include a panel of dielectric material having electrically conductive terminals thereon. The chip is mounted on the package substrate and electrically connected to the terminals of the package substrate. Typically, the chip and portions of the substrate are covered by an encapsulant or overmolding, so that only the terminal-bearing outer surface of the substrate remains exposed. Such a package can be readily shipped, stored and handled. The package can be mounted to a circuit panel such as a circuit board using standard mounting techniques, most typically surface-mounting techniques. Considerable effort has been devoted in the art to making such packages smaller, so that the packaged chip occupies a smaller area on the circuit board. For example, packages referred to as chip-scale packages occupy an area of the circuit board equal to the area of the chip itself, or only slightly larger than the area of the chip itself. However, even with chip-scale packages, the aggregate area occupied by several packaged chips is greater than or equal to the aggregate area of the individual chips.

Certain multi-chip packages can be referred to as "die stacked packages", in which a plurality of chips are mounted one above the other within a common package having an external interface. This common package can be mounted on an area of the circuit panel which may be equal to or just slightly larger than the area typically required to mount a single package containing a single chip. The die-stacked package approach conserves space on the circuit panel. Chips or other elements which are functionally related to one another can be provided in a common stacked package. The package may incorporate interconnections between these elements. Thus, the circuit panel to which the package is mounted need not include the conductors and other elements required for these interconnections. This, in turn, allows use of a simpler circuit panel and, in some cases, allows the use of a circuit panel having fewer layers of metallic connections, thereby materially reducing the cost of the circuit panel. Moreover, the interconnections within a die-stacked package often can be made with lower electrical impedance and shorter signal propagation delay times than comparable interconnections between individual packages mounted on a circuit panel. This, in turn, can increase the speed of operation of the microelectronic elements within the stacked package as, for example, by allowing the use of higher clock speeds in signal transmissions between these elements.

One form of chip package which has been proposed heretofore is sometimes referred to as a "ball stack." A ball stack package includes two or more individual units. Each unit incorporates a unit substrate similar to the package substrate of an individual package, and one or more microelectronic elements mounted to the unit substrate and connected to the terminals on the unit substrate. The individual units are stacked one above the other, with the terminals on each individual unit substrate being connected to terminals on another unit substrate by electrically conductive elements such as solder balls or pins. The terminals of the bottom unit substrate may constitute the terminals of the package or, alternatively, an additional substrate may be mounted at the bottom of the package and may have terminals connected to the terminals of the various unit substrates. Ball stack packages are depicted, for example, in certain preferred embodiments of U.S. Published Patent Applications 2003/0107118 and 2004/0031972, the disclosures of which are hereby incorporated by reference herein.

In another type of stack package sometimes referred to as a fold stack package, two or more chips or other microelectronic elements are mounted to a single substrate. This single substrate typically has electrical conductors extending along the substrate to connect the microelectronic elements mounted on the substrate with one another. The same substrate also has electrically conductive terminals which are connected to one or both of the microelectronic elements mounted on the substrate. The substrate is folded over on itself so that a microelectronic element on one portion lies over a microelectronic element on another portion, and so that the terminals of the package substrate are exposed at the bottom of the folded package for mounting the package to a circuit panel. In certain variants of the fold package, one or more of the microelectronic elements is attached to the substrate after the substrate has been folded to its final configuration. Examples of fold stacks are shown in certain preferred embodiments of U.S. Pat. No. 6,121,676; U.S. patent application Ser. No. 10/077,388; U.S. patent application Ser. No. 10/655,952; U.S. Provisional Patent Application No. 60/403,939; U.S. Provisional Patent Application No. 60/408,664; and U.S. Provisional Patent Application No. 60/408,644. Fold stacks have been used for a variety of purposes, but have found particular application in packaging chips which must communicate with one another as, for example, in forming assemblies incorporating a baseband signal processing chip and radiofrequency power amplifier ("RFPA") chip in a cellular telephone, so as to form a compact, self-contained assembly.

Despite all of these efforts in the art, still further improvement would be desirable.

SUMMARY OF THE INVENTION

A microelectronic package in accordance with an embodiment of the invention can include a substrate having a first surface, a second surface remote from the first surface, a plurality of substrate contacts, and a plurality of terminals electrically interconnected with the substrate contacts and exposed at the second surface. The package includes a microelectronic element having a first face, a second face remote from the first face, and element contacts exposed at the first face, with one of the first or second faces being juxtaposed with the first surface of the substrate. A plurality of conductive elements project above the first surface and are electrically connected with the element contacts and the substrate contacts. At least some of the conductive elements are electrically insulated from one another and adapted to simultaneously carry different electric potentials. An encapsulant overlies the first surface of the substrate, the conductive elements, and at least a portion of a face of the microelectronic element remote from the substrate. The encapsulant may define a major surface. A plurality of package contacts may overlie the face of the microelectronic element remote from the substrate and project above a height of the element contacts from the substrate. The package contacts can be electrically interconnected with the terminals of the substrate, such as through the conductive elements. The package contacts can include at least one of masses of conductive bond material or substantially rigid conductive posts. Top surfaces of the package contacts can be at least partially exposed at the major surface of the encapsulant.

In one embodiment, the major surface of the encapsulant can extend beyond peripheral edges of the microelectronic element at least towards peripheral edges of the substrate. In a particular embodiment, the package contacts can consist essentially of conductive bond material. Optionally, the package contacts include substantially rigid posts.

In a particular embodiment, at least portions of top surfaces of at least some conductive posts are exposed within openings which extend downwardly from the major surface of the encapsulant. The encapsulant may contact at least portions of the edge surfaces of the at least some posts. Edge surfaces of the at least some posts may be at least partially exposed within the respective openings in the encapsulant.

In one example, the encapsulant may contact at least portions of the top surfaces of the at least some posts such that the top surfaces of the at least some posts are only partially exposed within the openings. In a particular example, edge surfaces of the at least some posts may be fully covered by the encapsulant.

In one example, top surfaces of the conductive posts can be co-planar with the major surface of the encapsulant. In such example, in one case, edge surfaces of the at least some posts may be partially or fully covered by the encapsulant.

In one embodiment, the substrate can be a first substrate, and the package can further include a second substrate overlying the face of the microelectronic element which is remote from the first substrate. The second substrate can separate at least some of the package contacts from the microelectronic element. The first and second substrates can be electrically connected through the conductive elements. The conductive elements can be first conductive elements, and the microelectronic package can further include at least one second conductive element connected to a reference potential so as to form a controlled impedance transmission line with at least one first conductive element.

In one example, whether the package includes one or two substrates, at least some conductive elements can be directly connected with the microelectronic element.

In a particular example, the element contacts of the microelectronic element can face toward the first substrate. In another example, the element contacts of the microelectronic element can face away from the first substrate and be electrically interconnected with the first substrate.

In any of the examples in either the foregoing or the following, the microelectronic element can be a first microelectronic element, and the package can further include a second microelectronic element disposed between the first microelectronic element and the second substrate, the second microelectronic element being electrically interconnected with at least one of the first and second substrates.

In one example, a second substantially rigid structure being at least one of electrically conductive structure, thermally conductive structure or a spacer can project from at least the first surface to at least the second substrate. In one example, the second substrate may include a dielectric element.

The package contacts can include a plurality of substantially rigid conductive posts projecting away from a surface of the second substrate.

In one example, the second substrate can include a second dielectric element and the package contacts can project away from a surface of the second dielectric element. The second substrate can include a plurality of openings, and at least some of the conductive elements can extend through the openings in the second substrate.

In one embodiment, second substantially rigid electrically conductive posts can extend away from the first substrate, and the second conductive posts can be electrically connected with the first substrate. The second electrically conductive posts can be exposed at the major surface of the encapsulant within respective openings of the encapsulant.

In accordance with one embodiment of the invention, a method is provided of making a microelectronic package. In such method, a microelectronic assembly can be provided which includes a substrate having substrate contacts, a first surface, a second surface remote from the first surface, and a plurality of terminals exposed at the second surface. The assembly can include a microelectronic element having a front face, element contacts exposed at the front face, and a rear face remote therefrom, the front or rear face being juxtaposed with the first surface. The microelectronic assembly can further include a plurality of conductive elements projecting above the first surface and electrically connected with the element contacts and the substrate contacts. A plurality of package contacts can overlie the face of the microelectronic element remote from the face that is juxtaposed with the substrate first surface. The package contacts can be electrically interconnected with the conductive elements. In particular examples, the package contacts can include at least one of masses of conductive bond material or substantially rigid conductive posts extending above a height of the element contacts of the microelectronic element.

An encapsulant can then be formed to overlie the first surface of the substrate, the conductive elements, and at least a portion of a face of the microelectronic element remote from the substrate. The encapsulant can define a major surface and at least portions of top surfaces of the package contacts can be exposed at the major surface of the encapsulant.

In one embodiment, at least portions of the top surfaces can be flush with the major surface of the encapsulant.

In accordance with one embodiment of the invention, the package contacts might not initially be exposed at the major surface of the encapsulant. In such case, the encapsulant major surface may overlie second conductive elements, and openings can be formed in the encapsulant major surface to at least partially expose the second conductive elements. In a particular embodiment, the second conductive elements can serve as package contacts for the microelectronic package. In another example, after forming openings in the encapsulant layer, package contacts can be formed in electrical communication with the second conductive elements.

In one example, the step of forming the package contacts can include depositing masses of conductive bonding material onto the second conductive elements within the openings. In a particular example, the step of forming the package contacts can include plating conductive posts onto the second conductive elements exposed within the openings. In a particular embodiment, the conductive elements can include element contacts of the microelectronic element.

In one example, the package contacts can include at least one of substantially rigid conductive posts or conductive masses, and the package contacts can extend above a height of the element contacts from the first surface of the substrate.

The conductive posts can have top surfaces which are remote from the first surface of the substrate and edge surfaces which extend away from the top surfaces. The step of forming the openings can at least partially expose the edge surfaces.

In one embodiment, a fabrication method herein can be used to make each of first and second microelectronic packages, and then the second microelectronic package can be stacked atop the first microelectronic package. The first and second microelectronic packages can be electrically connected through the package contacts of the first microelectronic package and the terminals of the second microelectronic package. Alternatively, the first and second microelectronic packages can be electrically interconnected through the package contacts of the first and second microelectronic packages, or through the terminals of the first and second microelectronic packages.

DETAILED DESCRIPTION

Figure 1:
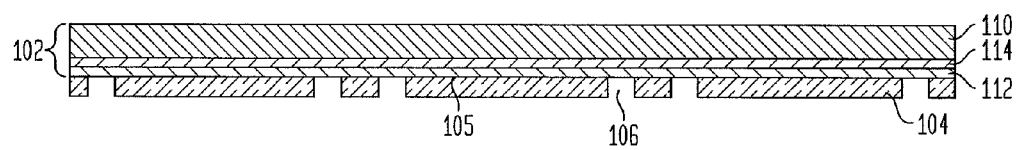
FIG. 1 is a sectional view illustrating a stage in a method of fabricating a substrate in accordance with an embodiment of the invention.

A method of fabricating a microelectronic package will now be described in accordance with an embodiment of an invention. Referring to FIG. 1, in one embodiment, a package substrate or an interconnection substrate can be fabricated using a layered metal structure 102 on a dielectric element 104, the layered metal structure having a first metal layer 110, a second metal layer 112, and a conductive etch barrier layer 114 between the first and second metal layers.

As used in this disclosure, terms such as "upper," "lower," "upwardly" and "downwardly," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the upper substrate is, indeed, above the lower substrate in the gravitational frame of reference. However, when the parts are turned over, with the top of the drawing facing downwardly in the gravitational frame of reference, the upper substrate is below the lower substrate in the gravitational frame of reference.

Directions parallel to a major surface 105 of the substrate are referred to herein as "horizontal" or "lateral" directions; whereas the directions perpendicular to the major surface are referred to herein as upward or downward directions and are also referred to herein as the "vertical" directions. A statement that one feature is disposed at a greater height "above a surface" than another feature means that both features are displaced from that surface in the same orthogonal direction but that the one feature is at a greater distance in the same orthogonal direction away from that surface than the other feature. Conversely, a statement that one feature is disposed at a lesser height "above a surface" than another feature means that both features are displaced from that surface in the same orthogonal direction and that the one feature is at a lesser distance in the same orthogonal direction from the surface than the other feature.

In one example, the first and second metal layers include or consist essentially of copper and the etch barrier layer includes a metal which is resistant to an etchant that is usable to pattern the first and second metal layers. For example, when the first and second metal layers are made of copper, the etch barrier layer can consist of nickel, chromium, or an alloy of nickel and chromium. In one example, the first metal layer has a much greater thickness than the second metal layer. In one example, the first metal layer can have a thickness between 50 and 300 microns, and the second metal layer can have a thickness of a few microns to a thickness smaller than 50 microns, and in any case smaller than the first metal layer thickness. The thickness of the second metal layer typically ranges between about 6 and about 30 microns.

As seen in FIG. 1, at this stage, the layered metal structure can be supported by a dielectric element 104, which, in a particular example, may include a plurality of openings 106 through which portions of the second metal layer 112 are exposed. As used in this disclosure, a statement that an electrically conductive structure is "exposed at" a surface of a dielectric structure indicates that the electrically conductive structure is available for contact with a theoretical point moving in a direction perpendicular to the surface of the dielectric structure toward the surface of the dielectric structure from outside the dielectric structure. Thus, a terminal or other conductive structure which is exposed at a surface of a dielectric structure may project from such surface; may be flush with such surface; or may be recessed relative to such surface and exposed through a hole or depression in the dielectric.

Dielectric element 104 may include a single layer of dielectric material, or may be a laminate including several sublayers. The dielectric element can be formed primarily from polymeric dielectrics such as polyimide, BT resin, epoxy or other dielectric polymers, and, in some examples, may include reinforcing fibers as, for example, glass fibers. The dielectric element 104 may be flexible or rigid. In a particular example, the dielectric element can be a polymer tape material such as a polyimide material, such as is commonly used in tape automated bonding ("TAB").

Figure 2:
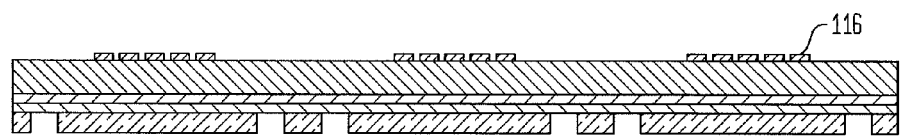
FIG. 2 is a sectional view illustrating a stage subsequent to the stage shown in FIG. 1 in a method of fabricating a substrate in accordance with an embodiment of the invention.
Figure 3:
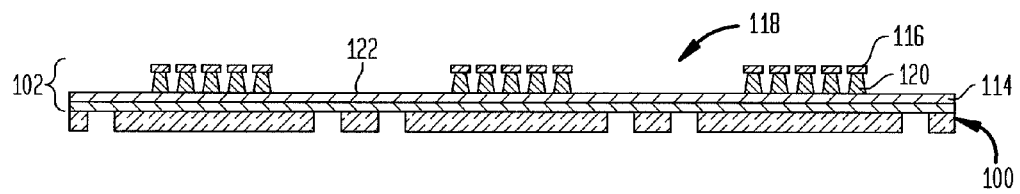
FIG. 3 is a sectional view illustrating a stage subsequent to the stage shown in FIG. 1 in a method of fabricating a substrate in accordance with an embodiment of the invention.
Figure 4:
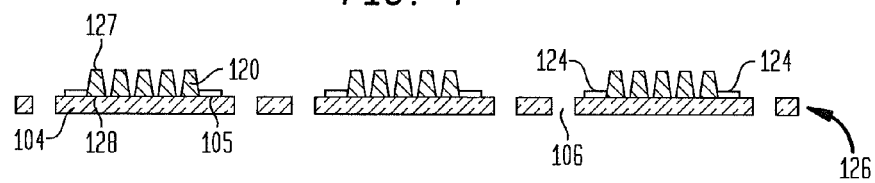
FIG. 4 is a sectional view illustrating a stage subsequent to the stage shown in FIG. 1 in a method of fabricating a substrate in accordance with an embodiment of the invention.

As seen in FIG. 2, a masking layer or other patterned sacrificial layer 116 is formed over the first metal layer. The masking layer can be formed of an etch-resistant metal or other material, such as by photolithography or other patterning technique, such as stenciling, screen-printing, or laser ablation, to name a few. Then, as seen in FIG. 3, the first metal layer can be patterned, such as by directing an etchant fluid in direction 118 towards the layered metal structure 102. This patterning process removes portions of the first metal layer not protected by the masking layer 116 so as to form a plurality of etched solid metal posts 120. As the etch barrier layer 114 is not attacked by the etchant used to pattern the first metal layer, the posts project above an exposed surface 122 of the etch barrier layer 114. The metal posts can be spaced apart from one another on the etch barrier layer so as to provide a series of individual conductors. As seen in FIG. 4, when the posts are formed by etching, they can be frusto-conical in shape, each having a base 128 wider than the tip 127 of the same post, the posts typically having edge surfaces which extend at an angle to the vertical direction.

FIG. 4 illustrates a subsequent stage of processing in which exposed portions of the etch barrier metal layer are removed, and the second metal layer 112 is patterned to form pads 124 and typically also traces (not shown) extending in a direction of the plane of the dielectric element 104, the pads and traces being electrically connected with the posts 120. The traces of the second metal layer can electrically connect at least some of the pads with at least some of the solid metal posts. As a result of the patterning, the openings in the dielectric element 104 now become through openings 106 extending through a thickness of structure 126.

In a variation of the above (FIGS. 1-4), similar structure 126 including posts, pads and traces can be formed by plating onto one or more surfaces of the dielectric layer 104, or by a combination of plating and etching steps. In a plated structure, the posts 120 typically have edge surfaces which are vertical with respect to the surface 105 of the dielectric element which the posts project.

Figure 5:
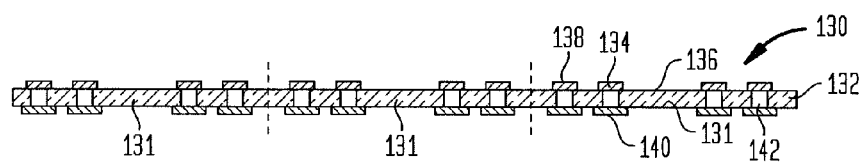
FIG. 5 is a sectional view illustrating a substrate used in a method in accordance with an embodiment of the invention.

Structure 126 having been defined, FIG. 5 illustrates a substrate 130 including a dielectric element 132, having a plurality of connection elements 134 and terminals 140 thereon, with metal or other conductive elements 142 electrically connecting the contacts 134 and the terminals 140. Substrate 130 typically is in form of a continuous or semi-continuous tape or sheet having a large number of regions 131. As explained below, each region 131 will constitute a portion of an individual package at the end of the process, and each region 131 includes the features which, as discussed below, will form a part of a single package. Like substrate 104, substrate 130 can be flexible or rigid and can be constructed of one or more of the same materials as substrate 104, and the dielectric element 132 thereof may include a single layer of dielectric material, or may be a laminate including several sublayers, be formed primarily from polymeric dielectrics such as polyimide, BT resin, epoxy or other dielectric polymers, and, in some examples, may include reinforcing fibers as, for example, glass fibers. Like that of substrate 104, the dielectric element can be a polymer tape material such as a polyimide material, such as is commonly used in tape automated bonding ("TAB").

Figure 6:
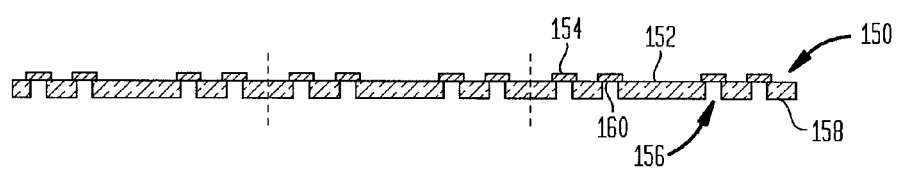
FIG. 6 is a sectional view illustrating a substrate used in a method in accordance with a variation of the embodiment of the invention.

As particular shown in FIG. 5, terminals 140 are formed in a layer separate from connection elements 134, these metal layers being separated from one another by dielectric element 132 and electrically connected to one another by conductive elements such as vias 32 extending through the dielectric element. Such an arrangement is commonly referred to as a "two-metal" structure. Alternatively, as depicted in FIG. 6, a substrate 150 can be formed as a single metal structure with a single metal layer constituting both the conductive connection elements 154 as exposed at a first surface 152 of substrate, and the terminals 160 as exposed within openings 156 at a second surface 158 of the substrate which is remote from the first surface. Alternatively, in a variation of the embodiment shown in FIG. 6, the substrate 150 can be used in an inverted arrangement in which the terminals overlie second surface 158 of the substrate, and the connection elements are exposed within openings which are open from the first surface 154 and extend through the dielectric element. In still further alternatives, one or more metallic layers constituting the conductive mounting elements, the terminals or both can be disposed within the thickness of the dielectric layer and exposed through holes to the appropriate surfaces.

Figure 7:
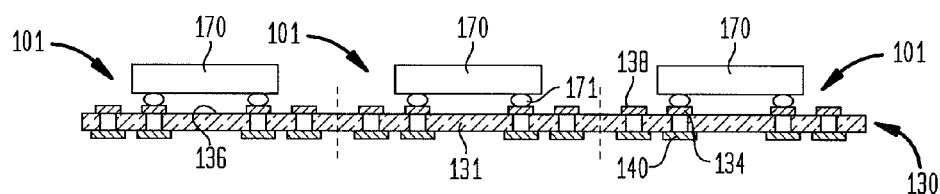
FIG. 7 is a sectional view illustrating a stage of fabrication subsequent to the stage of FIG. 5 or FIG. 6 in a method in accordance with an embodiment of the invention.

As seen in FIG. 7, microelectronic elements 170 are mounted on the first or "upper" surface 136 of a first substrate 130. Each region 131 has one or more of the microelectronic elements mounted thereon. In the particular embodiment illustrate, each region 131 of the lower substrate bears one microelectronic element. The microelectronic elements shown are semiconductor chips mounted in a face-down orientation, with the contacts, e.g., bond pads (not shown) of the chip connected to the conductive connection elements 134 of the substrate as, for example, by bonding the contacts to the conductive mounting elements using a bonding material 171 such as a solder. However, other techniques can be employed. For example, each microelectronic element 170 may be a packaged microelectronic element incorporating a package substrate (not shown) with package terminals thereon, these package terminals being connected to the conductive connection elements 134 on the first substrate. In still other variants, techniques such as an anisotropic conductive adhesive can be employed. The microelectronic element 170 within each region 131 of the substrate 130 is electrically connected through the conductive connection elements 134 of that region 131 to at least some of the mounting terminals 140 of the same region, and to at least some interlayer connection terminals 138 of that region or both. Microelectronic elements 170 may be mounted on the lower substrate using conventional techniques, either as part of the assembly process described herein or in a separate operation used to prepare the lower substrate 130.

After mounting the microelectronic elements 170 to the substrate 130, an underfill 174 (FIG. 8) can be injected between the substrate 130 and the contact-bearing faces 172 of the microelectronic elements such as to facilitate increased resistance to thermal and mechanical stress in the electrical connections between the microelectronic elements and the substrate via the bonding material 171 and connection elements 134. Then, substrate 100 can be mounted to rear surfaces 176 of the microelectronic elements 170, e.g., through an adhesive 178. In one embodiment, for example, when the substrate 100 includes a polymeric dielectric material, the adhesive can be compliant. However, in another embodiment in which substrate 100 has a coefficient of thermal expansion which is at or close to that of the microelectronic elements 170, the adhesive need not be compliant, and can even be a rigid material. Substrate 100 is mounted to the microelectronic elements 170 such that the conductive posts 120 thereon project away from a surface 108 of the substrate which is remote from microelectronic elements 170.

Figure 8:
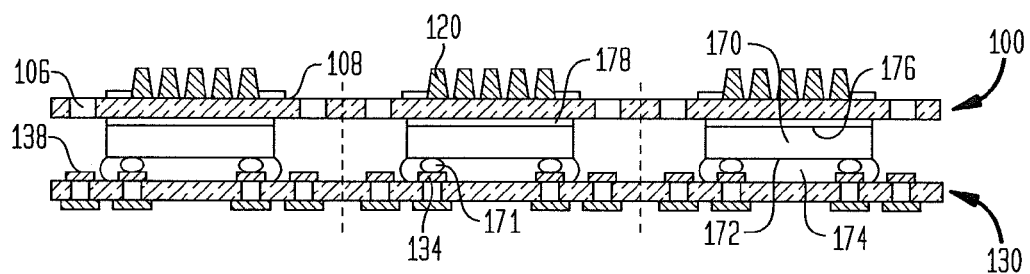
FIG. 8 is a sectional view illustrating a stage of fabrication subsequent to the stage of FIG. 7 in a method in accordance with an embodiment of the invention.
Figure 9:
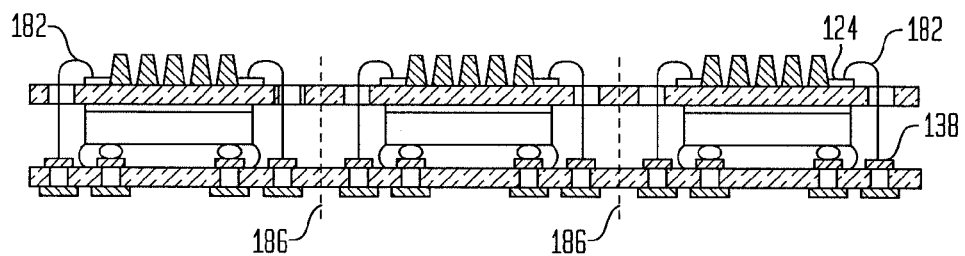
FIG. 9 is a sectional view illustrating a stage of fabrication subsequent to the stage of FIG. 8 in a method in accordance with an embodiment of the invention.
Figure 10:
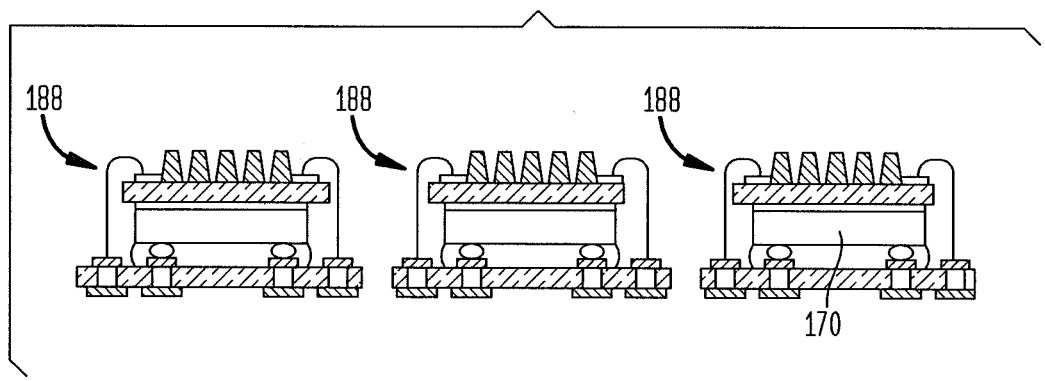
FIG. 10 is a sectional view illustrating a stage of fabrication subsequent to the stage of FIG. 9 or FIG. 9A in a method in accordance with an embodiment of the invention.

As further seen in FIG. 8, openings 106 in the second substrate are aligned with interlayer connection elements 138 of the first substrate when the substrates and the microelectronic elements are joined to form assembly 180. This then permits conductive elements 182 (FIG. 9) to be formed joining the interlayer connection elements 138 on the first substrate with the pads 124 of the second substrate, thus forming assembly 184. For example, a tip of a wire-bonding tool can be inserted through openings 106 in the second substrate to form wire bonds having first ends attached to second pads 138 and second ends attached to pads 124. Then, assembly 184 can be severed along lines 186 to separate the assembly into individual microelectronic assemblies 188 (FIG. 10), each containing a region of each of the first and second substrates, and a microelectronic element 170 between the two substrate regions which is electrically connected to each substrate region.

In a variation of the above processing (FIG. 9A), a plurality of individual substrates 126' each having posts 120 projecting therefrom and conductive elements, e.g., pads 124 thereon, can be attached to respective microelectronic elements 170 and electrically connected to the substrate 130 via wire bonds 182'. This processing can be performed while a plurality of the regions of the substrate 130 remain attached together in form of a continuous or semi-continuous substrate. In this case, the wire bonds 182' can be disposed beyond the peripheral edges 107 of each substrate 126'.

Figure 9A:
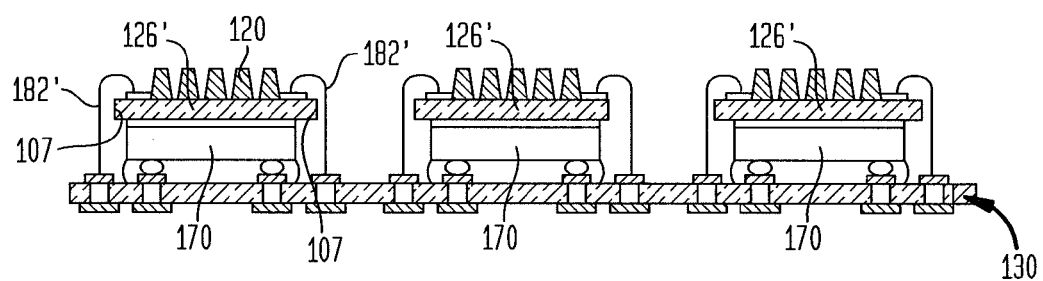
FIG. 9A is a sectional view illustrating a stage of fabrication subsequent to the stage of FIG. 7 in a method in accordance with a variation of the embodiment of the invention shown in FIGS. 8 and 9.
Figure 11:
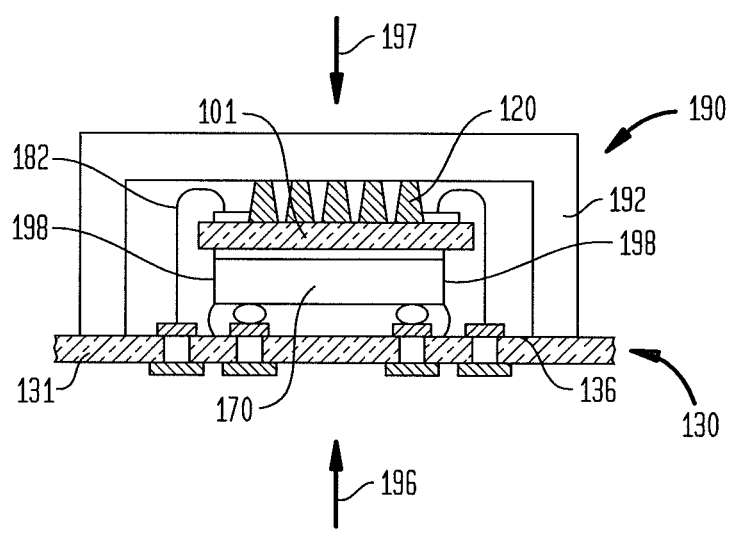
FIG. 11 is a sectional view illustrating a stage of fabrication subsequent to the stage of FIG. 10.
Figure 12:
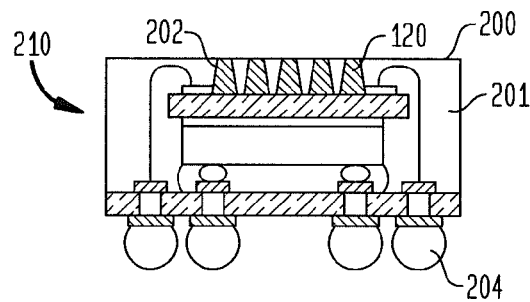
FIG. 12 is a sectional view illustrating a microelectronic package in accordance with an embodiment of the invention.

As shown in FIG. 11, a mold 190 can be used to form a molded encapsulant region which encompasses the structure of an assembly 188. For example, in a structure as seen in FIG. 9A, before severing the substrate 130, a mold plate 192 can be positioned to rest against surface 136 of the first substrate region 131. Then, an encapsulant is introduced into the mold through an inlet (not shown) to surround the wire bonds 182 and typically fill all spaces between individual posts 120 and between the edges 198 of the microelectronic element 170 and the wire bonds 182. The assembly then can be removed from the mold and optionally can be processed to at least partially cure the encapsulant, as represented in FIG. 12. The substrate 130 will also be severed so as to form individual unit 188 at that time. The conductive posts 120 are exposed at an exposed major surface 200 of the encapsulant which overlies the microelectronic element 170. The conductive posts extend within openings 202 of the encapsulant overlying the microelectronic element 170. Typically after removing the microelectronic assembly 188 having the encapsulant region from the mold 190, solder bumps 204 or balls can be joined with the terminals 140 to form a microelectronic package 210 as seen in FIG. 12.

Figure 13:
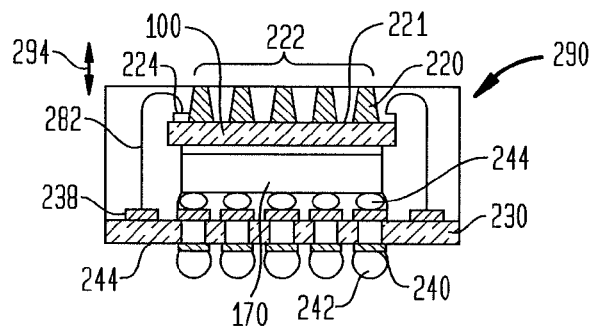
FIG. 13 is a sectional view through line 13-13 of FIG. 14 illustrating a microelectronic package in accordance with an embodiment of the invention.

FIG. 13 illustrates a microelectronic package 290 according to a particular embodiment in which each of the terminals 240, which can be pads, or pads with balls 242 of bonding material, e.g., solder balls, attached thereto, can be vertically aligned with a respective conductive post 220 exposed at surface 200 of the encapsulant remote therefrom. Such arrangement of terminals and posts in package 290 facilitates stacking and joining of a plurality of microelectronic packages 290 with each other in a stacked assembly as in FIG. 21 below.

Figure 14:
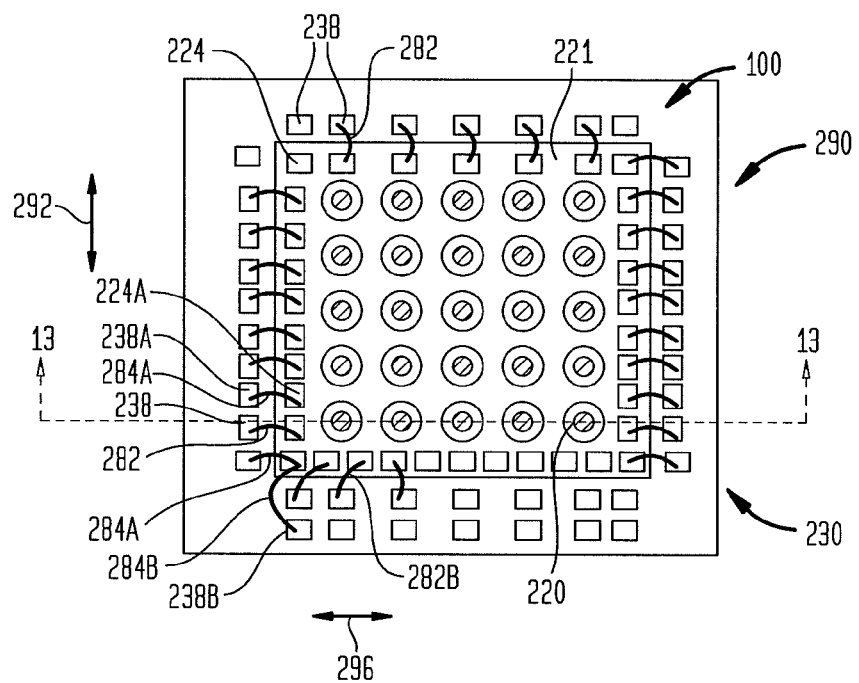
FIG. 14 is a top plan view looking towards an upper substrate of a microelectronic package in accordance with the embodiment of the invention shown in FIG. 13.

In microelectronic package 290, which is further illustrated in FIGS. 13-14, posts 220 form an area array 222 overlying a surface 221 of upper substrate 100. Pads 224 exposed at surface 221 of second substrate 100 can be electrically connected with pads 238 exposed at surface of lower substrate, such as by wire bonds 282, for example. As further shown in FIG. 14, wire bonds in package 290 can be arranged so as to provide transmission lines having a desired impedance or controlled impedance. Specifically, some of the pads on the lower substrate can be available for connection with a reference electric potential such as ground, a power supply voltage, or another electric potential which may change only slowly or may change very slowly or only within a narrow range relative to a typical rate of change of signals present at other posts 220. For example, pads 238A can be ground pads for electrical connection with ground through electrical connections 240, 242 provided at a surface 244 of substrate 230. Reference wire bonds 284A extend between such ground pads 224A, 238A of the substrates in runs adjacent to the runs of signal wire bonds 282. In this case, the runs of the reference wire bonds are at a substantially uniform spacing from the runs of the signal wire bonds in one or more of the lateral directions 292 along the surface 221 of substrate 100. Alternatively, or in addition thereto, package 290 can include reference wire bonds 284B which extend to reference pads 238B for connection with a reference potential, and runs of these reference wire bonds 284B can extend above or below the runs of signal wire bonds 282B aligned substantially in a vertical direction 294 (FIG. 13) with respect to the first surface 221 of substrate 100. Any or all of these particular implementations can be optionally provided in the same microelectronic package 290.

Figure 15:
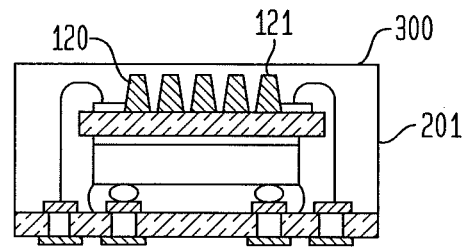
FIG. 15 is a sectional view illustrating a stage in a method of fabricating a microelectronic package in accordance with an embodiment of the invention.
Figure 16A:
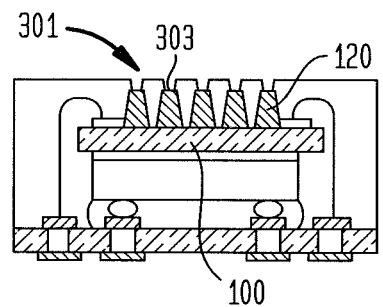
FIG. 16A is a sectional view illustrating a stage subsequent to the stage shown in FIG. 15 in a method of fabricating a microelectronic package in accordance with an embodiment of the invention.

In a variation of the above-described method (FIGS. 1-12), the conductive posts need not already be exposed when the assembly is removed from the mold. Instead, as seen in FIG. 15, the encapsulant can overlie top surfaces 121, i.e., ends of the posts which are remote from the substrate 100. The top surfaces 121 in this case are covered by the encapsulant such that they are buried below a major surface 300 of the encapsulant. Then, as shown in FIG. 16A, a plurality of openings 301 can be formed in the encapsulant which partially expose the top surfaces 121 of the posts, leaving other portions 303 of the top surfaces still covered by the encapsulant. In this case, edge surfaces 123 of the posts can remain covered by the encapsulant.

Figure 16B:
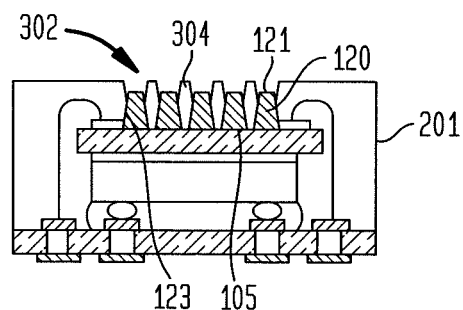
FIG. 16B is a sectional view illustrating a stage subsequent to the stage shown in FIG. 15 in a variation of the method shown in FIG. 16A.

In a variation of the embodiment in FIG. 16A, the openings 302 (FIG. 16B) in the encapsulant major surface at least partially expose top surfaces 121 of at least some posts and at least partially expose edge surfaces 123 of the same posts. An edge surface 123 of a post can be only partially exposed within an opening as shown in FIG. 16B or can be exposed to the surface 105 of the substrate. Portions 304 of the encapsulant 201 between adjacent posts 120 can remain as insulation between the posts and for containing the flow of a bond material, e.g., tin, solder, conductive paste, etc., which can be joined to the posts 120, such as in a stacked assembly of joined microelectronic packages, as described further below with reference to FIG. 21.

In one embodiment, at least a portion of a top surface and at least a portion of an edge surface of one post 120 can be exposed within one such opening in the major surface, and no surface of any other post 120 can be exposed within the same opening. Alternatively, at least portions of top surfaces and at least portions of edge surfaces of each of a plurality of two or more posts 120 can be exposed within an individual opening formed in the encapsulant major surface. In another case, at least portions of top surfaces and at least portions of edge surfaces of a plurality of two or more posts can be exposed within an individual opening formed in the encapsulant major surface.

In particular embodiments, two or more posts of a row of posts or, alternatively, one or more entire rows of posts can have at least portions of top surfaces and at least portions of edge surfaces exposed within an individual opening in the encapsulant major surface. In some cases, only portions of the top surfaces which can be less than entire top surfaces are exposed within particular openings. In some cases, entire top surfaces can be exposed within particular openings. In particular cases, only portions of the edge surfaces can be exposed within particular openings, and in some cases, edge surfaces can be exposed to a surface 105 of the substrate or to surfaces of conductive elements contacted by the posts. In a particular embodiment, entire top surfaces and portions of edge surfaces, i.e., portions which are less than the entire edge surfaces of each of a plurality of posts can be exposed within an individual opening in the encapsulant major surface.

Figure 17:
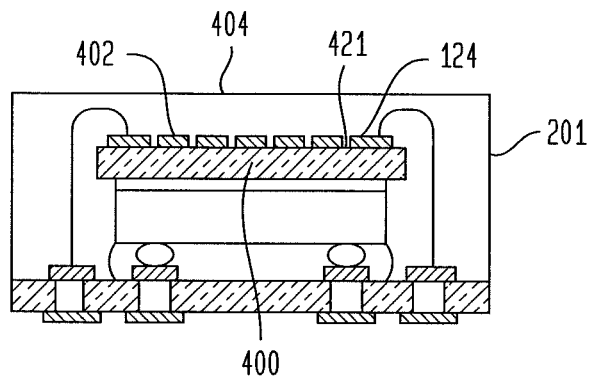
FIG. 17 is a sectional view illustrating a stage in a method of fabricating a microelectronic package in accordance with an embodiment of the invention.
Figure 18:
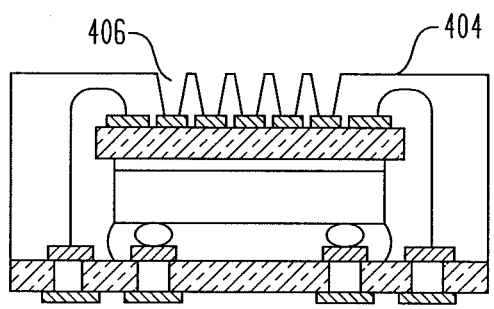
FIG. 18 is a sectional view illustrating a stage subsequent to the stage shown in FIG. 17 in a method of fabricating a microelectronic package in accordance with an embodiment of the invention.

FIG. 17 illustrates a variation of the above embodiments (FIG. 12; or FIGS. 13-14) in which the encapsulant 201 is formed atop conductive pads 402 exposed at the outwardly facing surface 421 of substrate 400. In that way, pads 402 are buried below an exposed surface 404 of the encapsulant, which, in one example, can be a major surface of the encapsulant. Like the conductive posts 220 of the above-described embodiment (FIGS. 12-13), the pads 402 can be electrically connected with bond pads 124 of the first substrate 400 via traces (not shown) or other conductors (not shown) for simultaneously carrying signals and other voltages at different electric potentials. After at least partially curing the encapsulant, openings 406 (FIG. 18) are formed therein which extend from the exposed surface 404 and at least partially expose respective pads 402. Subsequently, a conductive bond material, e.g., tin, solder, or conductive paste, etc., can be provided within each opening to form conductive masses 408 (FIG. 19) exposed at surface 404. In one variation of the package (FIG. 19), a metal such as copper, gold or a combination thereof can be plated onto the pads within the openings to form solid metal posts in place of masses 408 exposed at surface 404. The assembly can be planarized after forming the posts such that surfaces of posts plated in this way are flat and can be flush with surface 404.

In another alternative (FIG. 20), conductive masses 410, e.g., solder balls are joined with conductive pads 402 prior to the encapsulant being applied thereto. During molding, a top plate 192 (FIG. 11) of the mold contacts surface of the conductive masses and the conductive masses 410 may be compressed by the mold so as to flatten the surfaces of the conductive masses in contact with the top plate. As a result, when the package 490 is removed from the mold, the conductive masses have relatively wide flat surfaces 412 exposed at the major surface 404.

Figure 20:
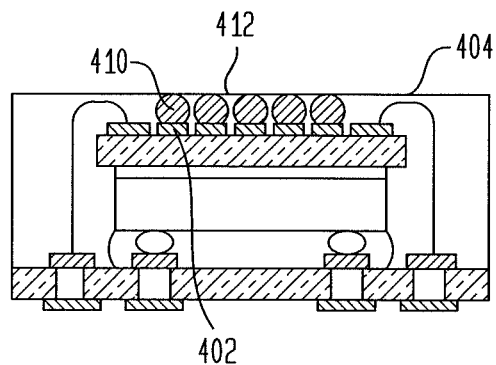
FIG. 20 is a sectional view illustrating a microelectronic package in accordance with an embodiment of the invention.
Figure 20A:
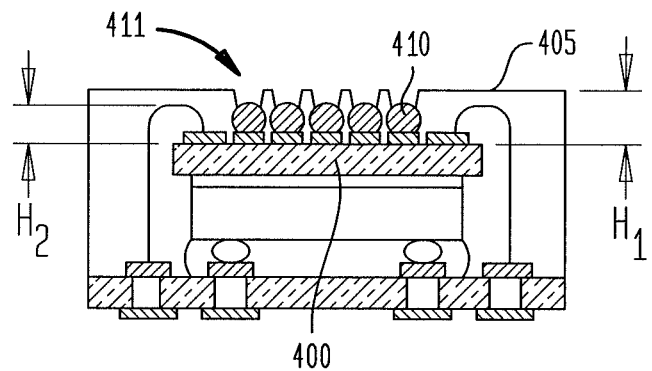
FIG. 20A is a sectional view illustrating a microelectronic package in accordance with a variation of the embodiment of the invention shown in FIG. 20.
Figure 20B:
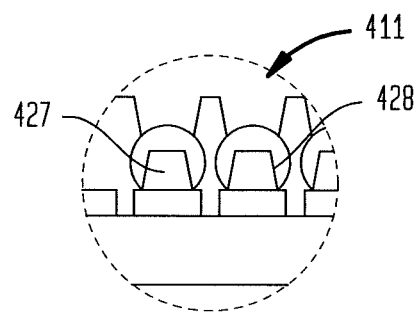
FIG. 20B is a sectional view illustrating a microelectronic package in accordance with another variation of the embodiment of the invention shown in FIG. 20.

In a variation thereof, as seen in FIG. 20A, the encapsulant can be formed having a major surface 405 at a height $H_1$ which is greater than a height $H_2$ to which conductive masses 410, e.g., solder balls extend above the upper substrate 400. After forming the encapsulant layer, laser ablation, mechanical milling or other means can be used to form openings 411 which expose respective ones of the conductive masses.

In a variation of the above embodiments (FIGS. 15-20A), two or more conductive posts or conductive masses can be exposed in an individual opening in the encapsulant layer. In a variation of the embodiment shown in FIG. 20A, the conductive masses 410 can contact top surfaces 427 and edge surfaces 428 of each conductive post, the conductive masses being partially exposed within openings 411.

Figure 21:
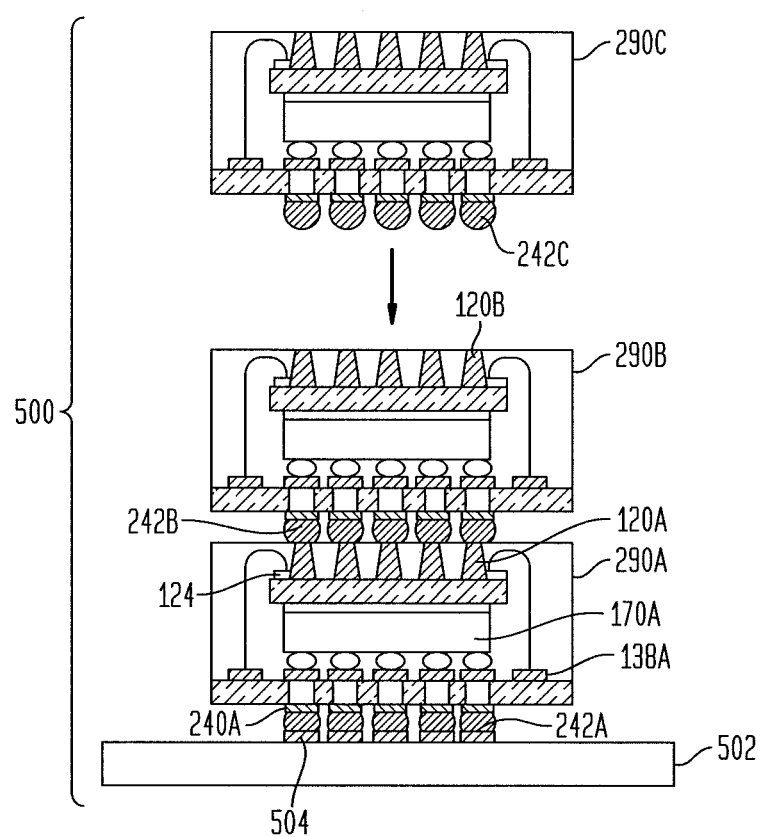
FIG. 21 is a sectional view illustrating a stage in a method of making a stacked microelectronic assembly in accordance with an embodiment of the invention.

FIG. 21 illustrates a process of forming a stacked assembly 500 including a plurality of microelectronic packages 290A, 290B, 290C, each being as described above. Solder balls 242A of a first microelectronic package can be joined with terminals 504 of a circuit panel 502, e.g., a flexible or rigid circuit board or card, mother board, etc. In this way, electrical connections for carrying signals and other voltages are provided between circuit panel 502 on the one hand and the microelectronic element 170A and interlayer conductive elements 138A of package 290A. Conductive posts 120A also carry signals and other voltages to and from the pads 504 of the circuit panel, via electrical connections through pads 124, wire bonds 282, and interlayer conductive elements 138A, which have electrical connections (not shown) with the terminals 240A and solder balls 242A.

The solder balls 242B of microelectronic package 290B can be joined with the conductive posts 120A of microelectronic package 290A after joining microelectronic package 290A with the circuit panel 502. FIG. 21 further illustrates microelectronic package 290C being positioned so that the solder balls 242C thereon are aligned with the conductive posts 120B of microelectronic package 290B, after which microelectronic package 290C is joined with microelectronic package 290B. In one variation, an assembly of microelectronic packages 290A, 290B, 290C can be formed by joining the solder balls on a package therein with respective conductive posts of another package therein, after which the solder balls 242A exposed at a bottom of such assembly can be joined to corresponding pads 504 of the circuit panel.

Additional variations are shown and described below as follows, referring to drawings which are simplified so that not all of the elements which are present are specifically shown or referenced. Also, not all elements which are shown in each drawing are necessarily present or required in each of variations as described below. With respect to the embodiments described herein, "upper substrate" or "lower substrate" need not conform to a gravitational frame of reference. In FIGS. 22-32, each of the elements referred to as an "upper substrate" or a "lower substrate" can be an individual substrate or can be a severed portion of a larger, e.g., continuous or semi-continuous, substrate. In addition, the relative positions of the upper and lower substrates in each microelectronic package or assembly can be reversed such that the lower substrate is in the place of the upper substrate that is illustrated in each respective figure, and the upper substrate is in the place of the lower substrate in each figure.

Figure 22:
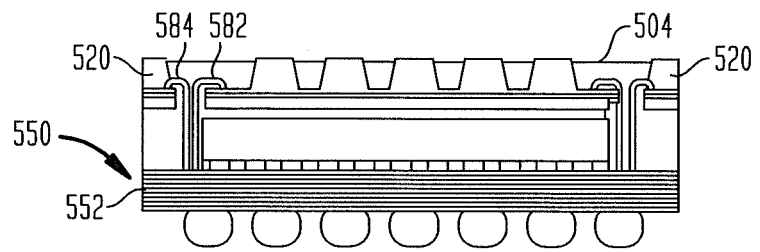
FIG. 22 is a sectional view illustrating a microelectronic package in accordance with an embodiment of the invention.

Thus, in an embodiment as seen in FIG. 22, reference wire bonds 584 can have runs extending in a vertical direction adjacent and at least substantially parallel to the runs of signal wire bonds 582, the reference wire bonds being electrically connected to reference conductive posts 520 exposed at major surface 504 of the encapsulant. The reference conductive posts are available for connection to a reference potential such as ground or a power supply voltage, such as for use together with the reference wire bonds 584 in controlling an impedance of the signal wire bonds. As further seen in FIG. 22, in one particular embodiment, the first substrate 550 can have a plurality of metal layers 552, of which at least one metal layer can be buried within a thickness of the dielectric element thereof.

Figure 23:
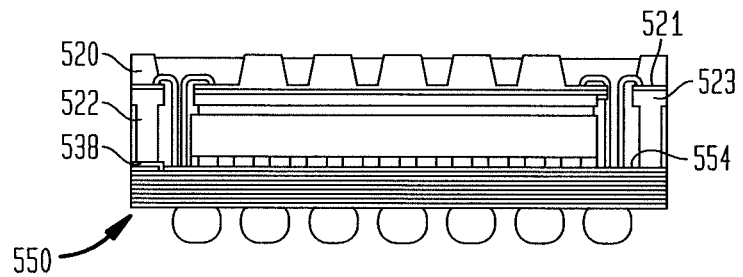
FIG. 23 is a sectional view illustrating a microelectronic package in accordance with an embodiment of the invention.

FIG. 23 illustrates a variation of the embodiment (FIG. 22) in which additional electrically conductive posts 522 electrically connected with conductive elements 538, e.g., traces, pads, etc., project above a first surface 554 of the lower substrate 550. The conductive posts 522 can be electrically connected with one or more reference posts 520 or reference conductor, such as for providing one or more reference potentials, e.g., a power supply voltage or ground. In one example, the posts 520 have bases 521 which are metallurgically joined or which are integral with corresponding adjacent surfaces 523 of the posts 522. In a particular embodiment, structure such as a spacer can take the place of the posts 522 for maintaining a desired spacing between the upper and lower substrates. Alternatively, a heat spreader or other thermal conductor can take the place of the conductive posts 522 or the electrically conductive posts 522 can also function as spacers or have a thermal conducting function.

Figure 24:
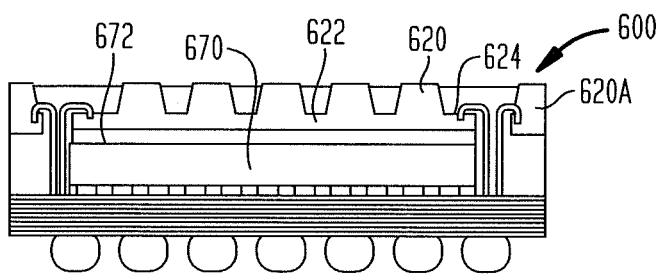
FIG. 24 is a sectional view illustrating a microelectronic package in accordance with an embodiment of the invention.

FIG. 24 illustrates a further variation of the embodiment (FIG. 22) in which the upper or second substrate 600 is a lead frame in which the posts 620 and traces 622 extending from the posts are formed integrally, such as by stamping or coining a metal foil when making the lead frame, and in some cases plating metal thereon. Such lead frame 600 can then be bonded to rear surface 672 of the microelectronic element 670, and then the resulting assembly can be placed within the mold and the encapsulant then formed as described above with respect to FIG. 11. Alternatively, rather than stamping or coining a metal foil, the upper substrate can be patterned from a layered metal structure such as described in the foregoing with respect to FIGS. 1-4, with the exception that the patterned layered metal structure can be through an adhesive to the face of the chip 670, i.e., without requiring an additional dielectric element such as a dielectric substrate supporting the posts and contacts thereon in the microelectronic package.

Figure 25:
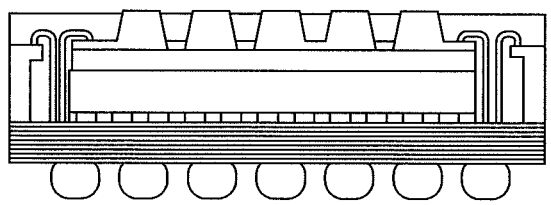
FIG. 25 is a sectional view illustrating a microelectronic package in accordance with an embodiment of the invention.

As in FIG. 22, one or more reference posts 620A and one or more reference wire bonds can carry a reference potential such as power or ground. FIG. 25 illustrates a further variation in which the one or more reference posts 620A of FIG. 24 can be omitted.

Figure 26:
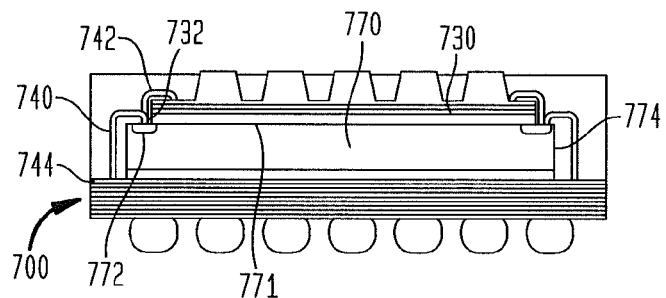
FIG. 26 is a sectional view illustrating a microelectronic package in accordance with an embodiment of the invention.

FIG. 26 illustrates a variation of the embodiment (FIGS. 13-14) in which the contact-bearing face 771 of microelectronic element 770 faces up, i.e., away from the lower substrate 700. The contacts 772, e.g., bond pads of the microelectronic element 770 can be provided adjacent peripheral edges 774 of the microelectronic element, such that the contacts are exposed beyond adjacent peripheral edges 732 of the upper substrate 730. First wire bonds 740 can electrically connect the contacts 772 of the microelectronic element with corresponding pads 744 on the lower substrate. Second wire bonds 742 can electrically connect the contacts 772 with corresponding pads (not shown) of the upper substrate. In one embodiment, one or more wire bonds can directly connect pads of the upper and lower substrates.

Figure 27:
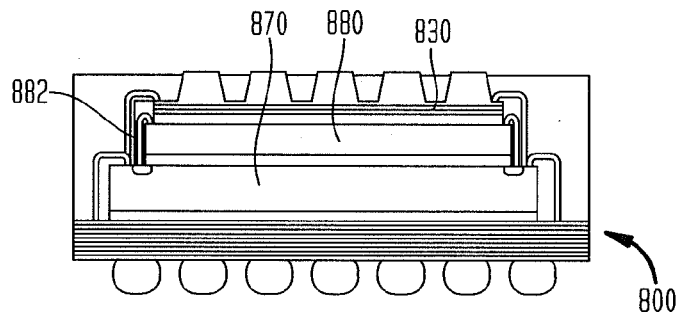
FIG. 27 is a sectional view illustrating a microelectronic package in accordance with an embodiment of the invention.

In a further variation as seen in FIG. 27, first and second microelectronic elements 870, 880 can each be mounted face up, i.e., with contact-bearing faces facing away from the lower substrate 800. The microelectronic elements can be electrically connected together via wire bonds 882 extending between contacts on each microelectronic element. Additional wire bonds 884, 886 can electrically connect the microelectronic elements with the upper and lower substrates 830, 800. In a further variation, a third, a fourth, or an even greater number of microelectronic elements can be mounted and electrically connected within the microelectronic package in like manner.

Figure 27A:
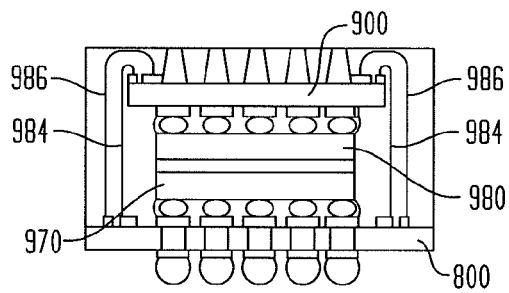
FIG. 27A is a sectional view illustrating a microelectronic package in accordance with a variation of the embodiment shown in FIG. 27.

FIG. 27A illustrates a variation of the embodiment shown in FIG. 27 in which two microelectronic elements 970, 980 are each mounted in flip-chip manner to the respective substrates 800, 900. The rear faces of the microelectronic elements can be back-bonded together as shown. As further seen in FIG. 27A, at least some of the wire bonds 984 in the microelectronic package can have controlled impedance. That is, wire bonds 984 which carry signals between elements, e.g., between the lower and upper substrates 800, 900, as seen in FIG. 27 can be flanked by other wire bonds 986 having vertical runs in parallel with the vertical runs of the signal wire bonds and at a substantially uniform spacing therefrom. The other wire bonds 986 are electrically connected to a reference potential, e.g., ground, a power supply voltage, or, alternatively, a voltage which is subject to change only very slowly in comparison with the rate of change of the signals carried by the signal wire bonds. These reference wire bonds 986 are electrically connected to the reference potential through contacts provided on each of the upper and lower substrates 800, 900.

In variations of the embodiment shown in FIG. 27A, one or more microelectronic elements can be flip-chip mounted to a respective one of the substrates 800, 900 and another microelectronic element can be mounted in a face-up orientation with respect to one of the substrates to which it is electrically connected through one or more wire bonds (not shown). In a particular variation of the embodiment shown in FIG. 27, a microelectronic element (not shown) can be flip-chip mounted to substrate 800, and microelectronic element 870 can be back-bonded to a rear face of the flip-chip mounted microelectronic element. That microelectronic element 870 can be electrically connected with substrate 800 as shown in FIG. 27, and another microelectronic element 880 can be electrically connected to lower substrate 800, the upper substrate 830, or microelectronic element 870 as shown and described above with respect to FIG. 27.

Figure 28:
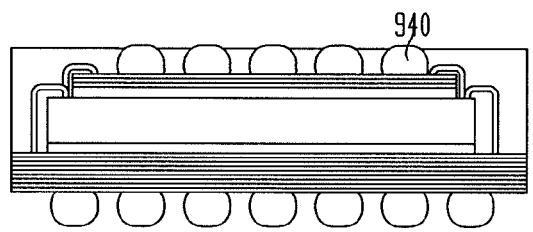
FIG. 28 is a sectional view illustrating a microelectronic package in accordance with an embodiment of the invention.

FIG. 28 illustrates a further variation of the embodiment (FIG. 26) which is similar to the embodiment of FIG. 20 in that solder balls 940 are joined with conductive elements, e.g., pads (not shown) on the upper substrate prior to forming the encapsulant.

Figure 19:
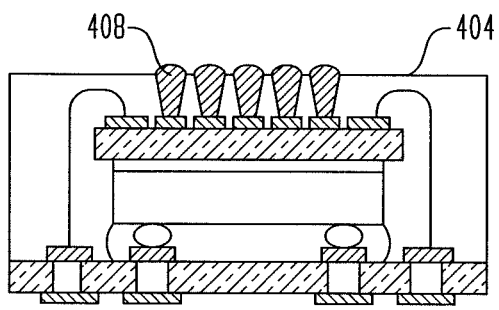
FIG. 19 is a sectional view illustrating a stage subsequent to the stage shown in FIG. 18 in a method of fabricating a microelectronic package in accordance with an embodiment of the invention.
Figure 29:
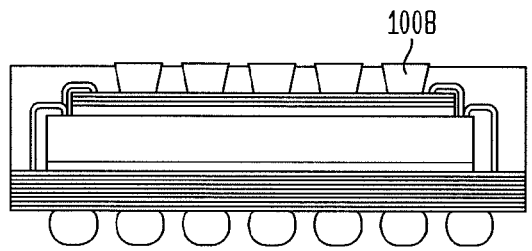
FIG. 29 is a sectional view illustrating a microelectronic package in accordance with an embodiment of the invention.

FIG. 29 illustrates a variation of the FIG. 26 embodiment which is also similar to the embodiment of FIG. 19, in that conductive masses 1008 can be formed subsequent to forming the encapsulant.

Figure 30:
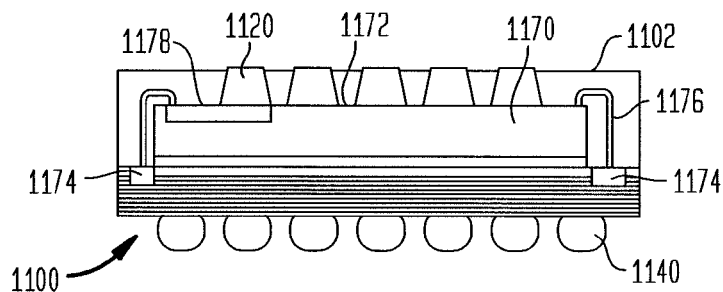
FIG. 30 is a sectional view illustrating a microelectronic package in accordance with an embodiment of the invention.

FIG. 30 illustrates yet another variation in which microelectronic element 1170 is mounted to the substrate 1100 with the contact-bearing face 1172 facing away from the substrate 1100. In this embodiment, the upper substrate is omitted. Conductive posts 1120, which, for example, can have a height between 50 and 300 microns, can be as described with respect to the above embodiment (FIGS. 1-14). The posts can extend away from the face 1172 of the microelectronic element and be exposed at surface 1102 of the encapsulant. In one embodiment, the conductive posts can be formed as described in commonly owned U.S. application Ser. No. 12/317,707, now U.S. Pat. No. 8,299,368; Ser. No. 12/462,208, abandoned; Ser. No. 11/824,484, now U.S. Pat. No. 7,911,805; Ser. No. 12/286,102, now U.S. Pat. No. 8,558,379; or Ser. No. 12/832,376, now U.S. Pat. No. 8,330,272. The posts 1120 are available for electrically connecting the microelectronic element 1170 to another package or element, as well as for electrically connecting the solder-ball, e.g., ball grid array (BGA) interface 1140 of substrate 1100 thereto via pads 1174, wire bonds 1176 and conductive elements 1178 extending along surface 1172 connecting the posts 1120 with the wire bonds 1176.

Figure 31:
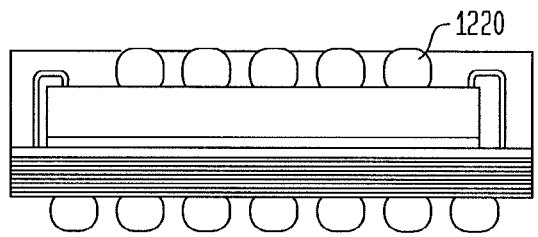
FIG. 31 is a sectional view illustrating a microelectronic package in accordance with an embodiment of the invention.

FIG. 31 illustrates a further variation of the embodiment (FIG. 30) in which conductive masses 1220 such as solder balls are provided in place of the conductive posts 1120 seen in FIG. 30.

Figure 32:
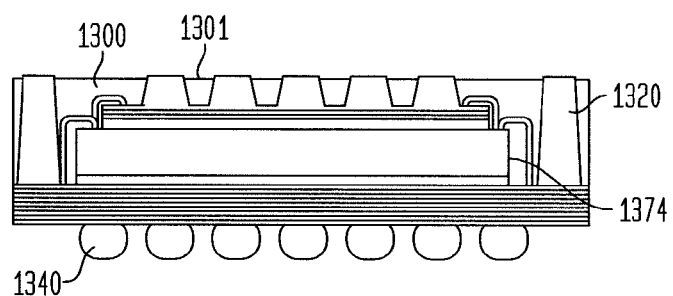
FIG. 32 is a sectional view illustrating a microelectronic package in accordance with an embodiment of the invention.

FIG. 32 illustrates a variation of the above embodiment (FIG. 26) having one or more additional conductive posts 1320 extending between the lower substrate and a surface 1302 of the encapsulant 1300. The conductive post can be electrically connected with one or more of the solder balls 1340. In one embodiment, the additional conductive post can be in form of a ridge, ring or portion thereof extending along a peripheral edge 1374 of the microelectronic element 1370, i.e., in a direction into and out of the paper on which FIG. 32 is provided. In one embodiment, the one or more additional conductive posts can carry time-varying signals. Alternatively, the one or more additional conductive posts 1320 can carry a reference potential such as ground or a power supply voltage.

Figure 33:
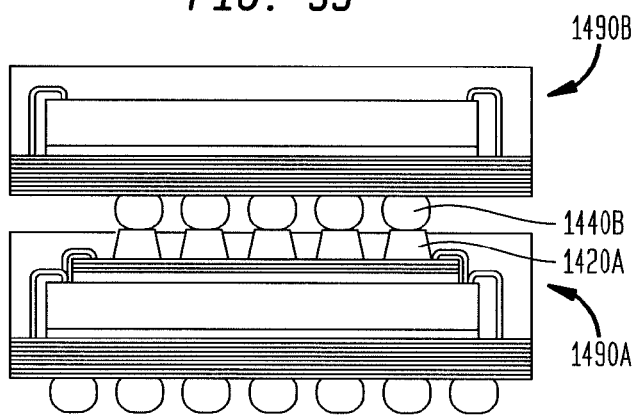
FIG. 33 is a sectional view illustrating a microelectronic assembly in accordance with an embodiment of the invention.

FIG. 33 illustrates a stacked assembly in accordance with a further embodiment in which terminals 1440B of an upper package are joined with connectors, e.g., conductive posts 1420A of a lower microelectronic package 1490A having a structure as shown and described above with respect to FIG. 26. FIG. 33 illustrates that the pitch, number of, and contact areas of connectors 1420A on microelectronic package 1490A can be standardized so as to mate with a corresponding BGA interface of another package 1490B, and that the other package need not have the same structure as package 1490A.

The foregoing descriptions of the preferred embodiments are intended to illustrate rather than to limit the present invention. Particular methods of fabricating microelectronic packages and structures therein can be as further described in commonly owned U.S. application Ser. No. 12/838,974 of Belgacem Haba titled "STACKABLE MOLDED MICROELECTRONIC PACKAGES", now U.S. Pat. No. 8,482,111.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:
1. A microelectronic package comprising:
a first substrate having a first surface, a second surface remote from the first surface, a plurality of first substrate contacts exposed at the first surface, and a plurality of terminals electrically interconnected with the first substrate contacts and exposed at the second surface;
a second substrate remote from the first substrate, the second substrate having a first surface facing towards the first surface of the first substrate, a second surface remote from the first surface, a plurality of second substrate contacts exposed at the second surface of the second substrate;
a microelectronic element disposed between the first surface of the first substrate and the first surface of the second substrate, the microelectronic element having a first face, a second face remote from the first face, and element contacts exposed at the first face, one of the first or second faces facing towards the first surface of the first substrate and another one of the first or second faces facing towards the first surface of the second substrate;

electrically conductive structure coupling electrically conductive elements on each of the first and second substrates;

a continuous encapsulant overlying the first surface of the first substrate, the electrically conductive structure, and at least a portion of the second surface of the second substrate, the continuous encapsulant defining a major surface and openings extending downwardly from the major surface; and a plurality of package contacts exposed at the major surface of the encapsulant and overlying the second surface of the second substrate, the package contacts projecting above a height of the second substrate contacts at least partly within the openings in the encapsulant, the package contacts being electrically interconnected with the element contacts of the microelectronic element through at least the electrically conductive structure, the package contacts including solid metal posts having frusto-conical shape of copper or gold projecting upwardly from the second surface of the second substrate, wherein at least top surfaces of the package contacts are at least partially exposed at the major surface of the encapsulant.

2. The package as claimed in claim 1, wherein the at least a portion of the microelectronic element extends beyond a peripheral edge of the second substrate in a direction parallel to the first surface of the second substrate.

3. The package as claimed in claim 1, wherein the major surface of the encapsulant extends beyond peripheral edges of the microelectronic element at least towards peripheral edges of the first substrate.

4. The package as claimed in claim 3, wherein top surfaces of at least some of the posts extend only a portion of a height of the openings in the major surface of the encapsulant and the encapsulant contacts at least portions of the edge surfaces of the at least some posts.

5. The package as claimed in claim 4, wherein the edge surfaces of the at least some posts are at least partially exposed within the respective openings in the encapsulant.

6. The package as claimed in claim 4, wherein edge surfaces of the at least some posts are fully covered by the encapsulant.

7. The package as claimed in claim 3, wherein top surfaces of the conductive posts are co-planar with the major surface of the encapsulant.

8. The package as claimed in claim 7, wherein edge surfaces of the at least some posts are fully covered by the encapsulant.

9. The package as claimed in claim 1,
wherein the electrically conductive structure includes a plurality of wire bonds projecting above the first surface of the first substrate and extending between the first substrate contacts and the second substrate contacts, at least some of the wire bonds being electrically insulated from one another and adapted to simultaneously carry different electric potentials.

10. The package as claimed in claim 9, wherein the wire bonds include first wire bonds and at least one second wire bond connected to a substrate contact for electrically connecting the at least one second wire bond to a reference potential such that the at least one second wire bond forms a controlled impedance transmission line with at least one of the first wire bonds.

11. The package as claimed in claim 9, further comprising second wire bonds directly electrically connected with the microelectronic element and contacts at a second surface of the second substrate, wherein the major surface of the encapsulant overlies the second wire bonds.

12. The package as claimed in claim 1, wherein the microelectronic element is a first microelectronic element, the package further comprising a second microelectronic element disposed between the first microelectronic element and the second substrate, the second microelectronic element being electrically interconnected with at least one of the first and second substrates.

13. The package as claimed in claim 1, wherein the first surface of the second substrate is attached to the microelectronic element.

14. The package as claimed in claim 1, wherein the solid metal posts are exposed at the major surface of the encapsulant.

15. The package as claimed in claim 1, wherein the package contacts are configured to simultaneously carry respective different electric potentials.

16. A microelectronic package comprising:
a first substrate having a first surface, a second surface remote from the first surface, a plurality of first substrate contacts exposed at the first surface, and a plurality of terminals electrically interconnected with the first substrate contacts and exposed at the second surface;

a second substrate remote from the first substrate, the second substrate having a first surface, a second surface remote from the first surface and a plurality of second substrate contacts exposed at the second surface of the second substrate;

a microelectronic element disposed between the first surface of the first substrate and the first surface of the second substrate, the microelectronic element having a first face, a second face remote from the first face, and element contacts exposed at the first face, one of the first or second faces being juxtaposed with the first surface of the first substrate;

electrically conductive structure coupling electrically conductive elements on each of the first and second substrates;

a continuous encapsulant overlying the first surface of the first substrate, the electrically conductive structure, and at least a portion of the second surface of the second substrate, the continuous encapsulant defining a major surface and openings extending downwardly from the major surface; and a plurality of package contacts exposed at the major surface of the encapsulant and overlying the second surface of the second substrate, the package contacts at least partly within the openings in the encapsulant and being electrically interconnected with the element contacts of the microelectronic element through the electrically conductive structure, the openings tapering continuously from the major surface so as to become smaller from the major surface of the encapsulant to pads exposed at the second surface of the substrate, the package contacts including at least one of masses of conductive bond material or posts.

17. The package as claimed in claim 16, wherein at least portions of top surfaces of at least some package contacts are exposed within the openings and the encapsulant contacts at least portions of the edge surfaces of the at least some package contacts.

18. The package as claimed in claim 16, wherein top surfaces of the package contacts are co-planar with the major surface of the encapsulant.

19. The package as claimed in claim 18, wherein edge surfaces of the package contacts are fully covered by the encapsulant.

20. The package as claimed in claim 16,
wherein the electrically conductive structure includes a plurality of wire bonds projecting above the first surface of the first substrate and extending between the first substrate contacts and the second substrate contacts, at least some of the wire bonds being electrically insulated from one another and adapted to simultaneously carry different electric potentials.

* * * * *